US010446564B2

(12) United States Patent
Portal et al.

(10) Patent No.: US 10,446,564 B2
(45) Date of Patent: Oct. 15, 2019

(54) NON-VOLATILE MEMORY ALLOWING A HIGH INTEGRATION DENSITY

(71) Applicants: Commissariat a l'energie atomique et aux energies alternatives, Paris (FR); Universite d'Aix-Marseille, Marseilles (FR)

(72) Inventors: Jean-Michel Portal, Saint-Savournin (FR); Marios Barlas, Grenoble (FR); Laurent Grenouillet, Claix (FR); Elisa Vianello, Grenoble (FR)

(73) Assignees: Commissariat a l'energie atomique et aux energies alternatives, Paris (FR); Universite d'Aix-Marseille, Marseilles (FR)

( * ) Notice: Subject to any disclaimer, the term of this patent is extended or adjusted under 35 U.S.C. 154(b) by 0 days.

(21) Appl. No.: 15/977,357

(22) Filed: May 11, 2018

(65) Prior Publication Data

US 2018/0331115 A1  Nov. 15, 2018

(30) Foreign Application Priority Data

May 12, 2017  (FR) ...................................... 17 54181

(51) Int. Cl.
*H01L 27/115* (2017.01)
*H01L 27/11524* (2017.01)
(Continued)

(52) U.S. Cl.
CPC .... *H01L 27/11524* (2013.01); *H01L 27/2436* (2013.01); *H01L 27/2472* (2013.01);
(Continued)

(58) Field of Classification Search
CPC combination set(s) only.
See application file for complete search history.

(56) References Cited

U.S. PATENT DOCUMENTS 7,016,222 B2 * 3/2006 Morikawa ............... G11C 11/15
365/148
8,598,560 B1  12/2013 Milojevic et al.
(Continued)

FOREIGN PATENT DOCUMENTS

CN   102738390    10/2012
EP   2 178 122 A1  4/2010

OTHER PUBLICATIONS

French Preliminary Search Report dated Jan. 29, 2018 in French Application 17 54181 filed on May 12, 2017 (with English Translation of Categories of Cited Documents and Written Opinion).
(Continued)

*Primary Examiner* — Matthew L Reames
(74) *Attorney, Agent, or Firm* — Oblon, McClelland, Maier & Neustadt, L.L.P.

(57) ABSTRACT

The invention relates to a non-volatile memory that comprises selection transistors. Each selection transistor includes a layer of semiconductor material with a channel region and conduction electrodes, a gate stack including a gate electrode and a gate insulator, an isolation trench between the transistors, a storage structure of the RRAM type comprising a control electrode, and a dielectric layer formed under the control electrode and in the same material as the gate insulator, comprising a central part directly above the isolation trench and ends extending directly above conduction electrodes, and configured so as to form conducting filaments. The said storage structure and the said selection transistors are formed in the same pre-metallization layer.

17 Claims, 4 Drawing Sheets

(51) Int. Cl.
*H01L 45/00* (2006.01)
*H01L 27/24* (2006.01)

(52) U.S. Cl.
CPC .......... *H01L 45/1253* (2013.01); *H01L 45/08* (2013.01); *H01L 45/1233* (2013.01); *H01L 45/146* (2013.01)

(56) References Cited

U.S. PATENT DOCUMENTS

| | | |
|---|---|---|
| 2010/0195371 A1 | 8/2010 | Ohba et al. |
| 2012/0012944 A1 | 1/2012 | Yi |
| 2013/0221317 A1 | 8/2013 | Pramanik et al. |
| 2014/0175365 A1* | 6/2014 | Chang ................. H01L 45/145 257/4 |
| 2014/0319449 A1 | 10/2014 | Pramanik et al. |
| 2015/0236260 A1 | 8/2015 | Pramanik et al. |
| 2016/0043138 A1 | 2/2016 | Yi |

OTHER PUBLICATIONS

Chin Yu Mei, et al., "28nm High-K Metal Gate RRAM with Fully Compatible CMOS Logic Processes," IEEE, 2013, 2 Pages.

* cited by examiner

Fig. 9
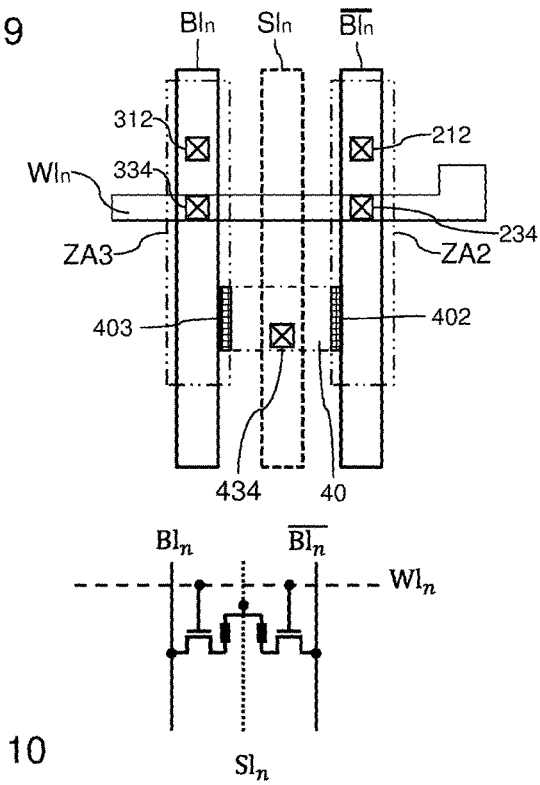
Fig. 10
Fig. 11
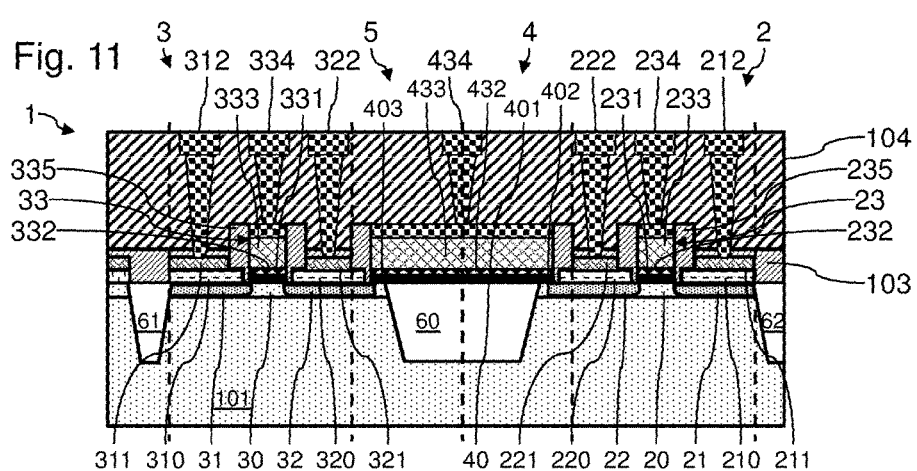

NON-VOLATILE MEMORY ALLOWING A HIGH INTEGRATION DENSITY

The invention relates to non-volatile memories of the RRAM type, and in particular, memories of this type exhibiting a maximum integration density.

In order to overcome the limits in terms of miniaturization, electrical power consumption, read/write speed and complexity of fabrication of floating-gate non-volatile memory technologies, the semiconductor industry is developing various alternative technologies.

Amongst the alternative non-volatile memory technologies under development, memories of the RRAM type offer a definite technical advantage.

Memories of the RRAM type are based on the formation and the reversible rupture of a conducting filament: a dielectric material, which is normally insulating, can be forced to be a conductor through a filament or a conducting path after the application of a sufficiently high voltage. Once the filament has been formed, it may be reset or programmed by a voltage applied in a suitable manner.

In the particular case of RRAM memories of the OxRAM type, the conducting filament is formed from oxygen holes in an insulating material composed of a metal oxide. OxRAM memories benefit from a very good thermal stability, in theory allowing the information to be reliably conserved for several years at high temperature.

An OxRAM memory cell may be produced starting from a basic memory location according to three known solutions.

In a first approach, the simplest, the memory location can be used as a basic memory cell, and used in a configuration in which parallel bit lines are crossed by perpendicular word lines, with the switching material placed between the word line and the bit line at each crossing point. This configuration is called a crossing-point cell. Given that this architecture can lead to a high stray current flowing through the non-selected memory cells from the neighbouring cells, the matrix of crossing points can have a very slow read access. Another aspect limiting this type of architecture is the over-consumption during the programming phases, the stray currents being added to the useful current at the switching of the addressed cell or cells.

In a second approach, a selection element may be added in order to eliminate this stray current, but this selection element leads to an electrical over-consumption due to an increase in the voltages used.

In a third approach, a field-effect transistor is added, facilitating the selection of a memory location, while at the same time limiting the current flowing in the cell, thus avoiding the over-currents in the transient regime which may alter or even destroy the cell.

In this third approach, the integration density is however greatly modified, the selection transistors occupying a non-negligible surface area of the substrate of the integrated circuit.

The document US2013/0119340 describes a dual memory location connected in series between two field-effect selection transistors. The dual memory location has a field-effect transistor structure and comprises a memory location between its gate and its source, and a memory location between its gate and its drain. The dual memory location comprises a gate insulator configured so as to selectively form a conducting filament between the gate and the source, on the one hand, and between the gate and the drain on the other.

The discrimination of the programming states of the memory locations assumes a large difference between the value of high resistance and the value of low resistance, notably owing to the dispersions in the fabrication process and to the wide variability in the value of high resistance.

The value of low resistance impacts the dimensioning of the selection transistors. In order to be able to use as low a value of low resistance as possible, a higher compliance current or setpoint current is required. A high level of compliance current requires, on the one hand, bulky selection transistors which limits the integration density and, on the other hand, a reduction in the lifetime of the memory locations, typically if the compliance current is higher than 250 µA. A need therefore exists notably to increase the integration density of such memory locations.

The invention aims to overcome one or more of these drawbacks. The invention thus relates to a non-volatile memory, such as defined in Claim 1.

The invention also relates to the variants of the dependent claims. Those skilled in the art will understand that each of the features of the dependent claims may be independently combined with the features of Claim 1 filed, without however forming an intermediate generalization.

Other features and advantages of the invention will become clearly apparent from the description of it presented hereinafter, by way of non-limiting example, with reference to the appended drawings, in which:

FIG. 9 is a top view of the configuration of another example of a memory cell according to the third embodiment;

FIG. 10 is a schematic representation of the memory cell in FIG. 9;

FIG. 11 is a cross-sectional view of one example of a memory cell according to a fourth embodiment of the invention.

Figure 1:
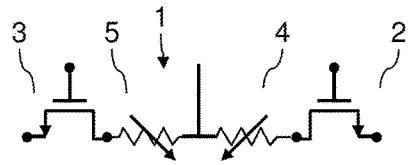
FIG. 1 is a schematic representation of a memory cell with dual memory locations and dual selection transistors designed to be implemented according to the invention.

FIG. 1 is a schematic representation of a memory cell 1 with dual memory locations and dual selection transistors, designed to be implemented according to the invention. The memory cell 1 thus comprises:
  a field-effect selection transistor 2 of the nMOS type and a memory location 4 connected in series between an output terminal and an intermediate node;
  a field-effect selection transistor 3 of the nMOS type and a memory location 5 connected in series between another output terminal and the intermediate node.

Such memory cells may be used in differential mode, in other words the cell is designed so that the logic levels stored in the memory locations of the same memory cell are systematically opposing.

Figure 2:
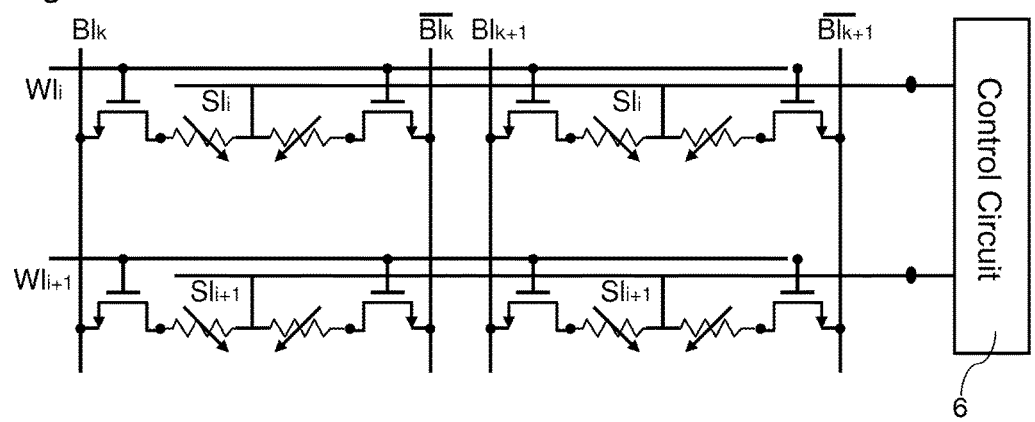
FIG. 2 is a schematic representation of one example of an interconnection of memory cells according to FIG. 1, for a differential application.

FIG. 2 is a schematic representation of one example of an interconnection for memory cells in FIG. 1, for a differential mode application.

For a column of memory cells with index k, a bit line $Bl_k$ is connected to the source of first selection transistors, and a complementary bit line $\overline{Blk}$ is connected to the source of second selection transistors.

For a column of memory cells with index k+1, a bit line $Bl_{k+1}$ is connected to the source of first selection transistors, and a complementary bit line $\overline{Bl_{k+1}}$ is connected to the source of second selection transistors.

The intermediate node of the cells with index i is connected to a programming line $Sl_i$. The gate of the selection transistors of the cells with index i is connected to a word line $Wl_i$. The intermediate node of the cells with index i+1 is connected to a programming line $Sl_{i+1}$. The gate of the selection transistors of the cells with index i+1 is connected to a word line $Wl_{i+1}$.

Figure 3:
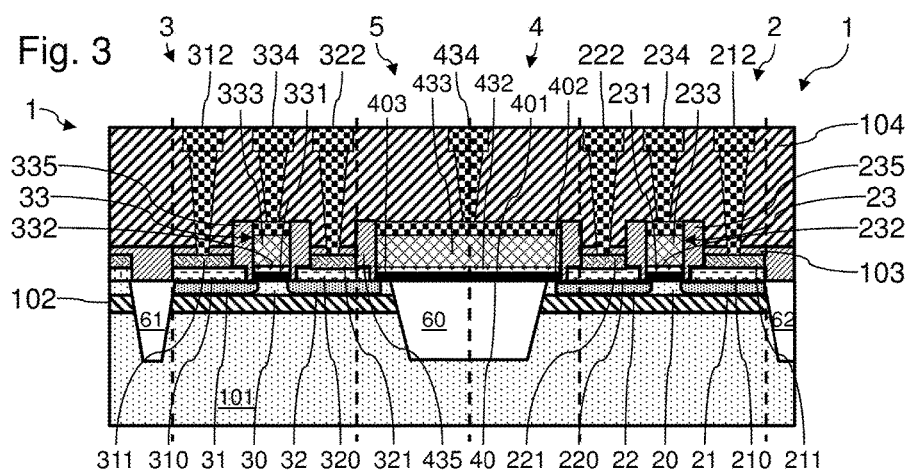
FIG. 3 is a cross-sectional view of one example of a memory cell according to a first embodiment of the invention.

FIG. 3 is a schematic cross-sectional view of one example of a cell of a non-volatile memory 1 according to a first embodiment of the invention. The cell 1 comprises a selection transistor 2 of the nMOS type adjoining a memory location 4, and another selection transistor 3 of the nMOS type adjoining another memory location 5. In this embodiment, the non-volatile memory cell 1 is formed on a substrate of the silicon-on-insulator type. A silicon substrate 101 (for example of the unintentionally doped type) is covered with a dielectric layer 102. The dielectric layer 102 is for example of the UTBOX (for Ultra Thin Buried Oxide) type, typically having a thickness of buried oxide equal to 50 nm at the most.

The selection transistors 2 and 3 and the memory locations 4 and 5 are formed on top of the dielectric layer 102. The boundaries between components here are illustrated by dashed lines. A deep isolation trench 60 is disposed between the selection transistors 2 and 3 and forms an electrical isolation between these transistors 2 and 3. A deep isolation trench 61 forms an electrical isolation between the selection transistor 3 and another transistor not shown. A deep isolation trench 62 forms an electrical isolation between the selection transistor 2 and another transistor not shown. Here, the deep isolation trenches 60 to 62 pass through the dielectric layer 102 and extend as far as the interior of the substrate 101. The deep isolation trenches 60 to 62 may also stop on the dielectric layer 102. The isolation trenches 60 to 62 may be formed, in a manner known per se, from a material such as silicon oxide.

The selection transistor 2 comprises a layer of semiconductor material, formed on the dielectric layer 102, between the deep isolation trenches 60 and 62. The layer of semiconductor material of the transistor 2 here is made of a silicon alloy or pure silicon (and preferably single-crystal silicon). The layer of semiconductor material comprises a channel region 20, a source region 21 and a drain region 22 formed on either side of the channel region 20.

According to one example:
the channel region 20 could be of the unintentionally doped type;
the source 21 and drain 22 regions have a dopant concentration in the range between $5*10^{17}$ cm$^{-3}$ and $1*10^{21}$ cm$^{-3}$ (this concentration being advantageously in the range between $5*10^{18}$ cm$^{-3}$ and 1020 cm$^{-3}$). The source 21 and drain 22 regions are bounded by these doped regions of the layer of semiconductor material.

A gate stack 23 is formed directly above the channel region 20. The gate stack comprises a gate insulator 231 formed on the channel region 20. The gate stack also comprises a gate electrode including a gate metal 232. The gate insulator 231 is disposed between the gate metal 232 and the channel region 20, in order to electrically isolate them. Here, the gate electrode also comprises an element 233 made of conducting polysilicon, formed on the gate metal 232.

A raised source 210 is advantageously formed directly above the source region 21. A silicide 211 is advantageously formed on the raised source 210, in order to improve the quality of the electrical contact of the source. A raised drain 220 is advantageously formed directly above the drain region 22. The drain region 22 here is formed in a substantially symmetrical manner on either side of the raised drain 220. A silicide 221 is advantageously formed on the raised drain 220, in order to improve the quality of the electrical contact of the drain.

In a manner known per se, the gate stack 23 comprises spacers 235 in order to electrically isolate the gate metal 232 from the source and from the drain of the transistor 2.

An interconnection metal contact 212 passes through a dielectric layer 103 and a passivation layer 104 and is in contact with the silicide 211 of the source of the transistor 2. A metal contact 222 passes through the dielectric layer 103 and the passivation layer 104 and is in contact with the silicide 221 of the drain of the transistor 2. An interconnection metal contact 234 passes through the passivation layer 104 and is in contact with the element 233 made of doped polysilicon.

The selection transistor 3 comprises a layer of semiconductor material, formed on the dielectric layer 102, between the deep isolation trenches 60 and 61. The layer of semiconductor material of the transistor 3 here is made of silicon alloy. The layer of semiconductor material comprises a channel region 30, a source region 31 and a drain region 32 formed on either side of the channel region 30.

A gate stack 33 is formed directly above the channel region 30. The gate stack comprises a gate insulator 331 formed on the channel region 30. The gate stack comprises also a gate electrode including a gate metal 332. The gate insulator 331 is disposed between the gate metal 332 and the channel region 30, in order to electrically isolate it. The gate electrode here also comprises an element 333 made of conducting polysilicon, formed on the gate metal 332.

A raised source 310 is advantageously formed directly above the source region 31. A silicide 311 is advantageously formed on the raised source 310, in order to improve the quality of the electrical contact of the source. A raised drain 320 is advantageously formed directly above the drain region 32. Here, the drain region 32 is formed in a substantially symmetrical manner on either side of the raised drain 320. A silicide 321 is advantageously formed on the raised drain 320, in order to improve the quality of the electrical contact of the drain.

In a manner known per se, the gate stack 33 comprises spacers 335, in order to electrically isolate the gate metal 332 from the source and from the drain of the transistor 3.

An interconnection metal contact 312 passes through the dielectric layer 103 and the passivation layer 104 and is in contact with the silicide 311 of the source of the transistor 3. A metal contact 322 passes through the dielectric layer 103 and the passivation layer 104 and is in contact with the silicide 321 of the drain of the transistor 3. An interconnection metal contact 334 passes through the passivation layer 104 and is in contact with the element 333 made of polysilicon.

A storage structure includes the memory locations 4 and 5. The memory locations 4 and 5 here are of the RRAM type, and more precisely of the OxRAM type. The storage structure comprises a dielectric layer 40. This dielectric layer 40 comprises a central part 401 formed directly above the isolation trench 60. The dielectric layer 40 comprises ends 402 and 403 on either side of the central part 401. The ends 402 and 403 extend directly above a part of the drain regions 22 and 32 respectively. In order to allow such an extension directly above a part of the drain regions 22 and 32, the ends 402 and 403 extend respectively directly above the drain regions 22 and 32 over a width preferably at least equal to 1 nm in order to conserve such an extension even with dispersions in the fabrication process. In order to optimize the integration density, this width is preferably equal to 15 nm at the most. The ends 402 and 403 are in contact with these drain regions 22 and 32, respectively. The dielectric layer 40 is formed from the same material as the gate insulator 231 and the gate insulator 331.

A control electrode stack is formed on the dielectric layer 40. The control electrode stack comprises a metal layer 432 formed on the dielectric layer 40. The metal layer 432 extends as far as directly above the ends 402 and 403 of the dielectric layer 40. Here, the metal layer 432 is advantageously (but not necessarily) formed from the same material as the gate metal 232 and the gate metal 332. Here, the control electrode stack furthermore comprises an element made of conducting polysilicon 433 formed on the metal layer 432. The element 433 is formed from the same material as the elements 233 and 333. An interconnection metal contact 434 passes through the passivation layer 104 and is in contact with the element 433.

When:
the dielectric layers 40, the gate insulator 231 and the gate insulator 331 are formed from the same material;
the metal layer 432, the gate metal 232 and the gate metal 332 are formed from the same material;
the elements 433, 233 and 333 are formed from the same material;
the process of fabrication of the memory cell 1 may be simplified by using the same steps for depositing and for patterning various layers at the same time for the selection transistors 2 and 3 and for the memory locations 4 and 5.

The control electrode is isolated from the drains of the transistors 2 and 3 by means of spacers 435. The drain regions 22 and 32 extend under the spacers 435, as far as directly above the stack of the control electrode. The spacers 435 can have the same composition as the spacers 235 and 335. The spacers 435 are positioned on either side of the dielectric layer 40 and of the stack of the control electrode. The spacers 435 may have a thickness different from that of the spacers 235 and 335.

The dielectric layer 40 is configured so as to selectively form a conducting filament through its end 402, between the metal layer 432 and the drain region 22. The dielectric layer 40 is also configured so as to selectively form a conducting filament through its end 403, between the metal layer 432 and the drain region 32. Memory locations 4 and 5 are thus formed between the spacers 435. The thickness of the ends 402 and 403, and also the material of the layer 40, are thus configured so as to allow the selective formation of conducting filaments. Owing to the presence of the isolation trench 60 between the drain regions 22 and 32, different programming potential differences may be applied for the memory locations 4 and 5.

Examples of materials and thicknesses will be detailed hereinbelow. A control circuit 6 (shown in FIG. 2) is also configured for applying suitable potential differences between the layer 432 and the drain regions 22 and 32, respectively, in order to programme these memory locations 4 and 5. Examples of biasing by such a control circuit 6 will be detailed hereinbelow.

The memory locations 4 and 5 are in direct contact with their selection transistors 2 and 3, respectively, and are formed in the same pre-metallization layer or FEOL layer. The undesirable RC time constants thus have a particularly reduced amplitude, promoting a high switching speed.

The etching rules furthermore allow a maximum integration density because the selection transistors 2 and 3 and the memory locations 4 and 5 are both formed in the pre-metallization layer or FEOL layer. The size of the memory cell 1 can thus be considerably reduced owing to the high etching resolution available for the processes of fabrication of pre-metallization layers. Furthermore, the definition of the routing in the post-metallization layer (or BEOL layer) is facilitated by the presence of the selection transistors 2 and 3 and of the memory locations 4 and 5 within the same pre-metallization layer.

The materials used to form selection transistors 2 and 3 in the pre-metallization layer for technological nodes of reduced dimensions are identical to those used to form RRAM memory locations. The same etch masks may thus be used to both form the memory locations 4 and 5 and the selection transistors 2 and 3. The number of steps in the fabrication process can thus be reduced.

Figure 4:
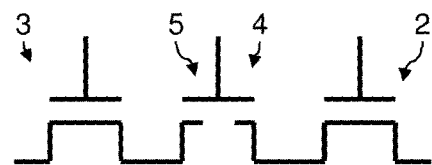
FIG. 4 is a schematic representation of the memory cell in FIG. 3.

FIG. 4 illustrates an equivalent circuit diagram of the structure formed. The memory locations 4 and 5 are formed with the same control electrode stack. Furthermore, the memory locations 4 and 5 are formed for the most part on the isolation trench 60, and thus only lead to an increase in surface area of substrate that is very limited with respect to the selection transistors 2 and 3 (since a surface area is in any case required to form the isolation trench 60).

The gate insulators 231 and 331, together with the layer 40, are for example selected from within the group consisting of $HfO_2$, HfSiO, HfSiON, HfSiAlO and TaOx. The gate insulator 231 is advantageously of the Hk type, in other words exhibiting a dielectric permittivity equal to at least 4, preferably equal to at least 8. The gate insulators 231 and 331 have for example a thickness in the range between 1.5 nm and 5 nm. The layer 40 has for example a thickness in the range between 1.5 and 10 nm, greater than the thickness of the gate insulators 231 and 331.

The gate metals 232 and 332, and also the metal layer 432, comprise at least a layer of a material selected from within the group consisting of TiN, W, Ti, TaN, Al and La.

Modes for formation of dissociated filaments for the memory locations 4 and 5, may be provided with the following successive conditions of formation:
for the formation of the filament of the memory location 5:
application of a voltage Vform to the control electrode (contact 434);
application of a voltage Vcomp to the gate contact 334;
application of a ground voltage to the source contact 312;
application of the voltage Vform to the source contact 212;

for the formation of the filament of the memory location 4:
- application of a voltage Vform to the control electrode (contact 434);
- application of a voltage Vcomp to the gate contact 234;
- application of a ground voltage to the source contact 212;
- application of the voltage Vform to the source contact 312;

With for example the following ranges of value:
Vform in the range between 1 and 5V;
Vset between 0.5V and 3V;
Vread in the range between 0.02V and 0.2V;
Vcomp 0.4 and 1V, corresponding for example to the threshold voltage of the selection transistors 2 and 3;
Vdd (power supply voltage for the circuits) in the range between 0.5V and 1.5V.

Such a design of a cell for a non-volatile memory 1 allows either a mode of operation of the differential type as detailed hereinabove, or a mode of operation of single-ended type (independent logic levels stored in the memory locations 4 and 5), depending on the signals generated by the control circuit 6. Such a design of a non-volatile memory cell 1 can for example facilitate the cooperation of memory cells and of logic cells within the same blocks. Such a non-volatile memory cell 1 in the mode of operation of the single-ended type also allows the integration density to be improved, owing to the positioning of the major part of the memory locations 4 and 5 directly above the isolation trench 60.

For a use in single-ended mode, the control circuit 6 may operate in the following manner:
for the formation of the filament of the memory locations 4 and 5:
- application of a voltage Vform to the control electrode (contact 434);
- application of a voltage Vcomp to the gate contacts 234 and 334;
- application of a ground voltage to the source contacts 212 and 312;

for the programming of the memory location 5:
- application of a voltage Vset to the control electrode;
- application of a voltage Vcomp to the gate contacts 234 and 334;
- application of a ground voltage to the source contact 312;

for the programming of the memory location 4:
- application of a voltage Vset to the control electrode;
- application of a voltage Vcomp to the gate contacts 234 and 334;
- application of a ground voltage to the source contact 212;

for resetting the memory location 5:
- application of a ground voltage to the control electrode;
- application of a voltage higher than Vcomp to the gate contacts 234 and 334;
- application of a voltage Vreset to the source contact 312;
- application of a ground voltage to the source contact 212;

for resetting the memory location 4:
- application of a ground voltage to the control electrode;
- application of a voltage higher than Vcomp to the gate contacts 234 and 334;
- application of a voltage Vreset to the source contact 212;
- application of a ground voltage to the source contact 312;

for reading the memory locations 4 and 5, an independent current reading may be carried out, for example with a read current of 10 μA. The resulting voltage can be read on the bit line comparing it with a reference voltage over a given time window. A voltage reading may also be carried out by biasing the bit line at a given voltage (for example a few hundreds of mV for a read time) and comparing the current flowing in the cell with a reference current over a given time window.
- application of a ground voltage to the control electrode;
- application of a voltage Vread to the gate contacts 234 and 334.

The first embodiment of the invention has been described with reference to selection transistors 2 and 3 of the nMOS type. For the application to selection transistors 2 and 3 of the pMOS type, the control circuit 6 will operate with different control signals. Memory cells with selection transistors of the nMOS type may of course be co-integrated with memory cells using selection transistors of the pMOS type.

For a use in differential mode with selection transistors 2 and 3 of the pMOS type, the control circuit 6 may operate in the following manner:
for the formation of the filament:
- application of a voltage Vform to the control electrode (contact 434);
- application of a voltage Vcomp to the gate contacts 234 and 334;
- application of a ground voltage to the source contacts 212 and 312;

for the programming of the memory cell:
- application of a voltage Vset to the control electrode;
- application of a voltage Vcomp to the gate contacts 234 and 334;
- application of a ground voltage to the source contacts 212 and 312;

for resetting the memory cell:
- application of a ground voltage to the control electrode;
- application of a voltage higher than Vcomp to the gate contacts 234 and 334;
- simultaneous application of a ground voltage to the source contact 312 and of a voltage Vreset to the source contact 212, or simultaneous application of a ground voltage to the source contact 212 and of a voltage Vreset to the source contact 312;

for reading the memory cell:
- application of a ground voltage to the control electrode;
- application of a voltage Vread to the gate contacts 234 and 334;
- application of a voltage Vdd/2 to the source contacts 212 and 312; with for example the ranges of value identical to those described with reference to the nMOS case.

For a use in single-ended mode with selection transistors of the pMOS type, the control circuit may operate in the following manner:
for the formation of the filament of the memory locations 4 and 5:
- application of a voltage Vform to the control electrode (contact 434);
- application of a voltage Vcomp to the gate contacts 234 and 334;
- application of a ground voltage to the source contacts 212 and 312;

for the programming of the memory location memory 5:
- application of a voltage Vset to the control electrode;

application of a voltage Vcomp to the gate contacts 234 and 334;
application of a ground voltage to the source contact 312;
for the programming of the memory location memory 4:
application of a voltage Vset to the control electrode;
application of a voltage Vcomp to the gate contacts 234 and 334;
application of a ground voltage to the source contact 212;
for resetting the memory location 5:
application of a ground voltage to the control electrode;
application of a voltage higher than Vcomp to the gate contacts 234 and 334;
application of a voltage Vreset to the source contact 312;
for resetting the memory location 4:
application of a ground voltage to the control electrode;
application of a voltage higher than Vcomp to the gate contacts 234 and 334;
application of a voltage Vreset to the source contact 212;
for reading the memory locations 4 and 5:
application of a ground voltage to the control electrode;
application of a voltage Vread to the gate contacts 234 and 334;
successive applications of a voltage Vdd/2 then of a ground voltage to the source contacts 212 and 312.

Figure 5:
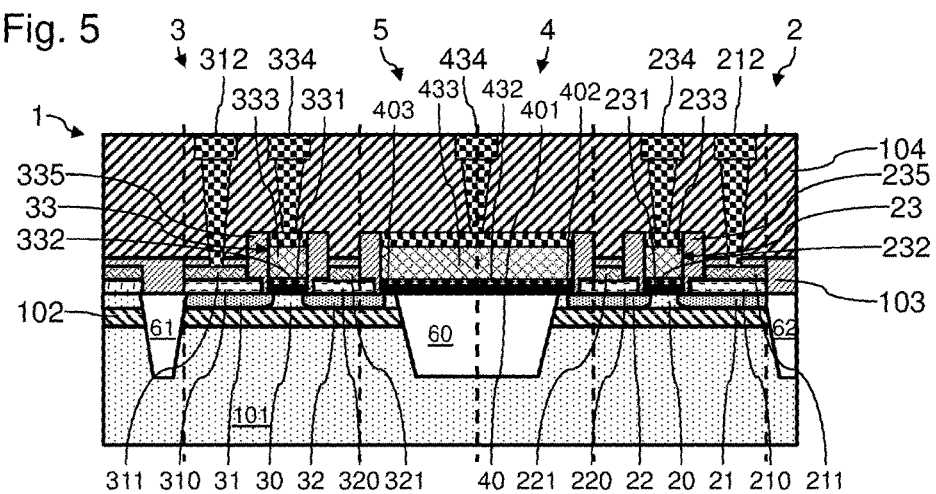
FIG. 5 is a cross-sectional view of one example of a memory cell according to a second embodiment of the invention.

FIG. 5 is a schematic cross-sectional view of one example of a cell of a non-volatile memory 1 according to a second embodiment of the invention. The cell 1 uses substantially the same structure as that of the first embodiment and comprises a selection transistor 2 of the nMOS type adjoining a memory location 4, and another selection transistor 3 of the nMOS type adjoining another memory location 5.

The cell 1 according to the second embodiment differs from that of the first embodiment only by the absence of the drain access contacts 322 and 222. Thus, the distance between the gate stack 33 and the memory location 5, on the one hand, and the distance between the gate stack 23 and the memory location 4, on the other hand, can be reduced. The integration density with such memory cells 1 can thus be increased. The switching speed of such memory cells 1 may also be increased.

Figure 6:
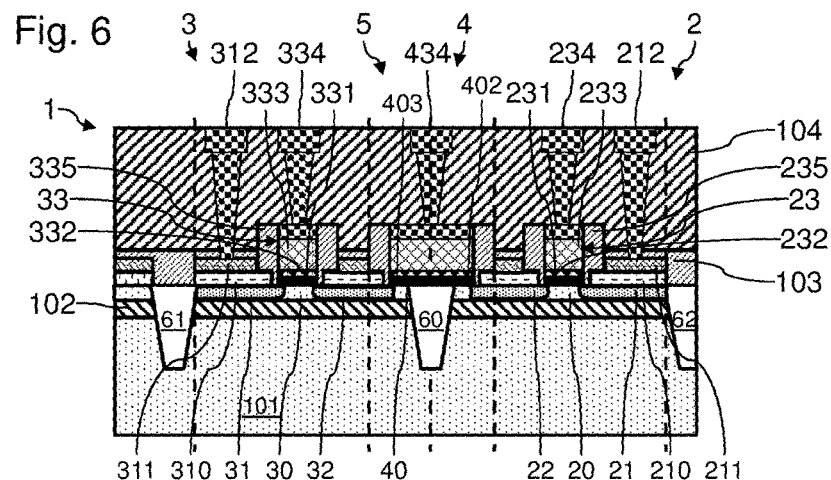
FIG. 6 is a cross-sectional view of one example of a memory cell according to a third embodiment of the invention.

FIG. 6 is a schematic cross-sectional view of one example of a cell of a non-volatile memory 1 according to a third embodiment of the invention. The cell 1 uses substantially the same structure as that of the first embodiment and comprises a selection transistor 2 of the nMOS type adjoining a memory location 4, and another selection transistor 3 of the nMOS type adjoining another memory location 5.

The cell 1 according to the third embodiment differs from that of the first embodiment only by a smaller width of the isolation trench 60. The width of the isolation trench 60 here is identical to that of the isolation trenches 61 and 62. As a consequence, the memory locations 4 and 5 also have a smaller width than in the first embodiment. The integration density of such memory cells 1 can thus be increased.

Figure 7:
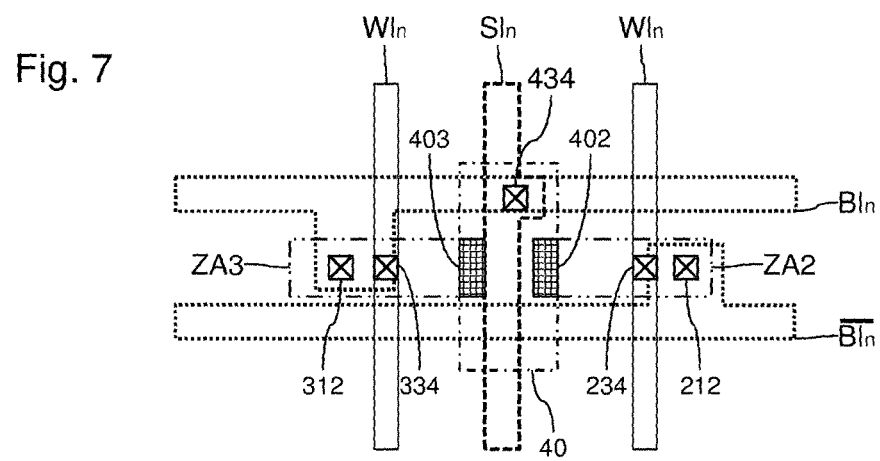
FIG. 7 is a top view of the configuration of one example of a memory cell according to the third embodiment.
Figure 8:
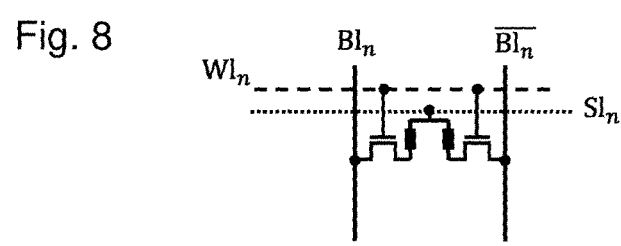
FIG. 8 is a schematic representation of the memory cell in FIG. 7.

FIG. 7 is a top view of the configuration of one example of a memory cell according to the third embodiment. FIG. 8 is a schematic representation of the memory cell in FIG. 7. Here, the layer of semiconductor material of the transistor 3 is denoted ZA3. The layer of semiconductor material of the transistor 2 here is denoted ZA2. A programming line Sln, a bit line Bl$_n$, a complementary bit line $\overline{Bln}$, and two word lines Wln can be identified. The ends 402 and 403 of the dielectric layer 40 form a superposition with the layers ZA2 and ZA3, respectively. The layers ZA2 and ZA3 are aligned.

The programming line Sln here is perpendicular to the direction of conduction in the layers ZA2 and ZA3. In this configuration, it is easier to control the voltage drops in the formation or programming phase.

FIG. 9 is a top view of the configuration of another example of a memory cell according to the third embodiment. FIG. 10 is a schematic representation of the memory cell in FIG. 9. Here, the layer of semiconductor material of the transistor 3 is denoted ZA3. The layer of semiconductor material of the transistor 2 is denoted ZA2. A programming line Sln, a bit line Bl$_n$, a complementary bit line $\overline{Bln}$, and a word line Win can be identified. The ends 402 and 403 of the dielectric layer 40 form a superposition with the layers ZA2 and ZA3, respectively. The layers ZA2 and ZA3 are parallel.

Here, the programming line Sln is parallel to the direction of conduction in the layers ZA2 and ZA3. In this configuration, the leakage currents are greatly limited without having to bias the bit lines, and the surface area of substrate occupied by the memory cell is reduced.

FIG. 11 is a schematic cross-sectional view of one example of a cell of a non-volatile memory 1 according to a fourth embodiment of the invention. The cell 1 uses substantially the same structure as that of the first embodiment and comprises a selection transistor 2 of the nMOS type adjoining a memory location 4, and another selection transistor 3 of the nMOS type adjoining another memory location 5.

The cell 1 according to the fourth embodiment only differs from that of the first embodiment by the use of a bulk substrate, and hence the absence of a dielectric layer 102 between the substrate 101, on the one hand, and the selection transistors 2 and 3 and the memory locations 4 and 5 on the other.

The invention claimed is:
1. A non-volatile memory, comprising:
a first selection transistor comprising:
a first layer of a semiconductor material in which a first channel region and first and second conduction electrodes are formed, and
a first gate stack formed on the first channel region and including a first gate electrode and a first gate insulator disposed between the first gate electrode and the first channel region;
a second selection transistor comprising:
a second layer of semiconductor material in which a second channel region and third and fourth conduction electrodes are formed, and
a second gate stack formed on the second channel region and including a second gate electrode and a second gate insulator disposed between the second gate electrode and the second channel region;
an isolation trench disposed between the first and second selection transistors; and
a storage structure of the RRAM type comprising:
a control electrode, and
a dielectric layer formed under the control electrode, comprising a central part directly above the isolation trench and having first and second ends respectively extending directly above the first and third conduction electrodes, the dielectric layer being configured to selectively form a first conducting filament between the control electrode and the first conduction electrode, and to selectively form a second conducting filament between the control electrode and the third conduction electrode, wherein the dielectric layer, the first gate insulator, and the second gate insulator are formed in a same material, the storage structure and the first and second selection transistors being formed in a same pre-metallization layer.

2. The non-volatile memory according to claim 1, further comprising a control circuit configured to apply signals to the control electrode, to the first and second gate electrodes of the first and second selection transistors, respectively, and to the second and fourth conduction electrodes, to selectively create or eliminate the first and second conducting filaments.

3. The non-volatile memory according to claim 2, wherein the control circuit is configured to apply the control signals to simultaneously form the first conducting filament and eliminate the second conducting filament.

4. The non-volatile memory according to claim 1, wherein a ratio between an electrical resistance through the first end of the dielectric layer after elimination of the conducting filament and after formation of the first conducting filament is in a range between 4 and 7.

5. The non-volatile memory according to claim 1, wherein a thickness of the dielectric layer is in a range between 1.5 nm and 10 nm.

6. The non-volatile memory according to claim 1, wherein the same material of the dielectric layer is selected from the group composed of $HfO_2$, HfSiO, HfSiON, HfSiAlO, and TaOx.

7. The non-volatile memory according to claim 1, wherein the first and second ends extend directly above the first and third conduction electrodes over a width equal to at least 5 nm.

8. The non-volatile memory according to claim 7, wherein the first and second ends extend directly above the first and third conduction electrodes over a width equal to 15 nm or less.

9. The non-volatile memory according to claim 1, wherein the first and second selection transistors and first and second memory locations of the storage structure are formed on an insulating layer separating them from a semiconductor substrate, the first and second conducting filaments being selectively formed in the first and second memory locations, respectively.

10. The non-volatile memory according to claim 1, wherein the control electrode and the first and second gate electrodes of the first and second transistors comprise a layer formed in a same conducting material.

11. The non-volatile memory according to claim 10, wherein the control electrode and the first and second gate electrodes comprise a layer of material selected from the group composed of TiN, W, Ti, TaN, Al, and La.

12. The non-volatile memory according to claim 1, wherein the first and third conduction electrodes lack a metal contact that passes through the dielectric layer.

13. The non-volatile memory according to claim 1, wherein the first and second layers of semiconductor material of the first and second transistors are made of a silicon alloy, the first to fourth conduction electrodes having a doping concentration in a range between $5*10^{17}$ cm$^{-3}$ and $1*10^{21}$ cm$^{-3}$.

14. The non-volatile memory according to claim 1, wherein the storage structure is disposed between the first and second selection transistors.

15. The non-volatile memory according to claim 1, wherein the dielectric layer and the first and second gate insulators are disposed in a same plane.

16. The non-volatile memory according to claim 1, wherein the central part of the dielectric layer is formed on the isolation trench.

17. The non-volatile memory according to claim 1, wherein the first and second ends of the dielectric layer are in contact with the first and third conduction electrodes, respectively.

* * * * *